United States Patent
Chang et al.

(10) Patent No.: US 11,012,087 B2
(45) Date of Patent: May 18, 2021

(54) ENCODING AND DECODING ARCHITECTURE FOR HIGH SPEED DATA COMMUNICATION SYSTEM AND RELATED PHYSICAL LAYER CIRCUIT, TRANSMITTER AND RECEIVER AND COMMUNICATION SYSTEM THEREOF

(71) Applicant: M31 TECHNOLOGY CORPORATION, Hsinchu County (TW)

(72) Inventors: Ching-Hsiang Chang, Taipei (TW); Yueh-Chuan Lu, Hsinchu County (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 80 days.

(21) Appl. No.: 16/701,088

(22) Filed: Dec. 2, 2019

(65) Prior Publication Data

US 2020/0106457 A1   Apr. 2, 2020

Related U.S. Application Data

(63) Continuation-in-part of application No. 15/956,709, filed on Apr. 18, 2018, now abandoned.

(Continued)

(51) Int. Cl.
*H03M 9/00* (2006.01)
*H03M 7/00* (2006.01)

(52) U.S. Cl.
CPC ............. *H03M 7/005* (2013.01); *H03M 9/00* (2013.01)

(58) Field of Classification Search
CPC ............... H03M 13/2906; H03M 9/00; H03M 13/3769; H03M 7/3066
(Continued)

(56) References Cited

U.S. PATENT DOCUMENTS 6,259,387 B1 * 7/2001 Fukazawa ............... H03M 9/00
                                                                    341/100
6,437,725 B1 * 8/2002 Kwak ..................... H03M 9/00
                                                                    341/100
(Continued)

FOREIGN PATENT DOCUMENTS

| WO | WO2006095313 A1 | 9/2006 |
| WO | WO2013138478 A1 | 9/2013 |
| WO | WO2014139863 A1 | 9/2014 |

OTHER PUBLICATIONS

Office Action and Search Report dated Nov. 28, 2019 issued by Taiwan Intellectual Property Office for counterpart application 107141765.

*Primary Examiner* — Linh V Nguyen
(74) *Attorney, Agent, or Firm* — WPAT, P.C., Intellectual Property Attorneys; Anthony King

(57) ABSTRACT

A physical layer circuit at a transmitter includes an encoding chain and a plurality of flip-flops. The encoding chain, including encoding units coupled in series, is configured to encode a plurality of symbols to generate a plurality of first wire states. The encoding units are arranged to receive the symbols respectively, and convert respective symbol values of the symbols to the first wire states respectively. A first encoding unit is configured to convert a symbol value of a corresponding symbol according to a second wire state provided by a second encoding unit. The flip-flops are arranged to receive and output the first wire states according to a clock signal, respectively. One of the flip-flops is coupled between the first encoding unit and the second (Continued)

encoding unit. The second wire state provided by the second encoding unit is sent to the first encoding unit through the one of the flip-flops.

21 Claims, 13 Drawing Sheets

Related U.S. Application Data

(60) Provisional application No. 62/590,352, filed on Nov. 23, 2017.

(58) Field of Classification Search
USPC .................................................. 341/100, 101
See application file for complete search history.

(56) References Cited

U.S. PATENT DOCUMENTS

| | | | | |
|---|---|---|---|---|
| 6,684,275 B1* | 1/2004 | Goldstein | ............ | G11C 7/1006 341/100 |
| 6,804,265 B1* | 10/2004 | Naumann | ............. | H04J 3/1623 370/504 |
| 7,290,190 B2* | 10/2007 | Obara | ............ | G01R 31/318572 714/726 |
| 8,378,719 B1* | 2/2013 | Pace | ...................... | H03K 23/66 327/115 |
| 2004/0205095 A1* | 10/2004 | Gressel | ................... | G06F 7/582 708/253 |
| 2006/0012497 A1* | 1/2006 | Tokuhiro | ................ | H03M 9/00 341/101 |
| 2007/0162155 A1* | 7/2007 | Zucker | .................. | G06F 13/385 700/1 |
| 2013/0208778 A1* | 8/2013 | Harikumar | ........ | H04L 25/03019 375/232 |
| 2018/0350412 A1* | 12/2018 | Lee | .......................... | H03M 9/00 |

* cited by examiner

| Symbol input value | Previous wire state, interval N-1 | | | | | |
|---|---|---|---|---|---|---|
| | +x | -x | +y | -y | +z | -z |
| 000 | +z | -z | +x | -x | +y | -y |
| 001 | -z | +z | -x | +x | -y | +y |
| 010 | +y | -y | +z | -z | +x | -x |
| 011 | -y | +y | -z | +z | -x | +y |
| 1xx | -x | +x | -y | +y | -z | +z |

Fig. 3B

| Present wire state (received during interval N) | Previous wire state (received during interval N-1) | | | | | |
|---|---|---|---|---|---|---|
| | +x [100] | -x [011] | +y [010] | -y [101] | +z [001] | -z [110] |
| +x state [100] | n/a | 1xx | 000 | 001 | 010 | 011 |
| -x state [011] | 1xx | n/a | 001 | 000 | 011 | 010 |
| +y state [010] | 010 | 011 | n/a | 1xx | 000 | 001 |
| -y state [101] | 011 | 010 | 1xx | n/a | 001 | 000 |
| +z state [001] | 000 | 001 | 010 | 011 | n/a | 1xx |
| -z state [110] | 001 | 000 | 011 | 010 | 1xx | n/a |

FIG. 4B

ENCODING AND DECODING ARCHITECTURE FOR HIGH SPEED DATA COMMUNICATION SYSTEM AND RELATED PHYSICAL LAYER CIRCUIT, TRANSMITTER AND RECEIVER AND COMMUNICATION SYSTEM THEREOF

CROSS-REFERENCE TO RELATED APPLICATIONS

The present application is a continuation-in-part of U.S. patent application Ser. No. 15/956,709 filed Apr. 18, 2018 and entitled "ENCODING AND DECODING ARCHITECTURE FOR HIGH-SPEED DATA COMMUNICATION SYSTEM AND RELATED PHYSICAL LAYER CIRCUIT, TRANSMITTER AND RECEIVER AND COMMUNICATION SYSTEM THEREOF", which claims the benefit of U.S. provisional patent application No. 62/590,352, filed on Nov. 23, 2017, each of which is incorporated herein by reference.

BACKGROUND

The present disclosure relates generally to high-speed data communications, and more particularly, to encoding and decoding architecture for high-speed serial data communication system and related method, physical layer circuit, transmitter and receiver and communication system thereof.

Mobile devices, such as smartphones, include a variety of components for different purposes, such as application processors, displays, CMOS image sensors. These components need to be interconnected by physical interfaces. For example, the application processor may provide frame data to the display through an interface for presenting visual contents. Alternatively, the CMOS image sensors may provide sensed image data to the application processor through an interface for exporting photos or videos.

The Mobile Industry Processor Interface (MIPI) specifications, which are standardized by the MIPI alliance, are widely used for signal communications and data transfer between the above mentioned components in the mobile devices. MIPI C-PHY is one of the MIPI specifications, which is newly developed and defined in order to meet requirement of high-speed transmission and provide high throughput for specific data, such as frame data or image data. MIPI C-PHY introduces 3-phase symbol encoding to transmit data symbols on 3-wire lanes, or trios, where each trio includes an embedded clock. These signals having three levels, do not use the standard NRZ format of signaling, and are single ended. At any given point in time, no signals are at the same voltage levels. The MIPI C-PHY effectively can achieve high-speed signal communications and can provide high throughput with a bit rate of at least 2.5 Gbps per lane.

To reach such high data rate, delay of hardware components need to be very short in order to avoid timing violation. However, in order to optimize energy, supply voltage of a mobile device is usually configured to be as low as possible. Hence, due to the low voltage operation and huge gate count in modern hardware components, it is difficult to shorten delays (such as gate delays) of the hardware components (such as combination logic circuits) in a modern complicated serial communication system, such as a MIPI C-PHY communication system. As a result, timing violation may occur if the overall gate delays of hardware components fail to keep up with a timing requirement of a unit interval of the transmission.

SUMMARY

In view of the above-mentioned problem, it is one object of the present disclosure to provide an encoding architecture and a corresponding decoding architecture, thereby to avoid a potential timing violation in a high-speed serial data communication system, such as MIPI C-PHY. In the encoding architecture and decoding architecture of the present disclosure, encoding and decoding circuits are implemented with multiple encoding and decoding units coupled in series, respectively. One of the encoding units can generate a wire state by encoding a symbol according to another wire state provided by another of the encoding units. One of the decoding units can generate a symbol by decoding a wire state according to another wire state provided to another of the encoding units. In some embodiments, a sequence of the encoding circuit and a serializer are inverted compared to encoding architecture in the conventional art, while a sequence of the decoding circuit and a deserializer are also inverted compared to decoding architecture in the conventional art.

Some embodiments described herein comprise a physical layer circuit at a transmitter. The physical layer circuit comprises an encoding chain and a plurality of first flip-flops. The encoding chain is configured to encode a plurality of symbols to generate a plurality of first wire states. The encoding chain comprises a plurality of encoding units coupled in series, arranged to receive the symbols respectively. The encoding units are configured to convert respective symbol values of the symbols to the first wire states respectively. A first encoding unit of the encoding units is configured to convert a symbol value of a corresponding symbol according to a second wire state provided by a second encoding unit of the encoding units. The first flip-flops, coupled to the encoding units to receive the first wire states respectively, are arranged to output the first wire states according to a first clock signal, respectively. One of the first flip-flops is coupled between the first encoding unit and the second encoding unit, and the second wire state provided by the second encoding unit is sent to the first encoding unit through the one of the first flip-flops.

Some embodiments described herein comprise a physical layer circuit at a receiver. The physical layer circuit comprises a plurality of first flip-flops, a decoding chain and a second flip-flop. The first flip-flops are arranged to output a plurality of first wire states according to a first clock signal respectively. The decoding chain, coupled to the first flip-flops, is configured to decode the first wire states to generate a plurality of symbols. The decoding chain comprises a plurality of decoding units coupled in series, arranged to receive the first wire states respectively. The decoding units are configured to convert the first wire states to respective symbol values of the symbols respectively. A first decoding unit of the decoding units is configured to convert a corresponding first wire state according to a second wire state provided by one of the first flip-flops coupled to a second decoding unit of the decoding units. The second flip-flop is coupled between the one of the first flip-flops and the first decoding unit. The second wire state provided by the one of the first flip-flops is sent to the first encoding unit through the second flip-flop.

According to one embodiment of the present disclosure, a physical layer circuit at a transmitter is provided. The physical layer circuit comprises: an encoding chain and a parallel-to-serial (P2S) converter. The encoding chain has a plurality of encoding unit coupled in series and is arranged to receive a plurality of first symbols and convert each of the symbols to a corresponding wire state, thereby to generate a plurality of wire states. The P2S converter is coupled to the encoding chain and arranged to receive the plurality of wire states and serialize the plurality of wire states to provide a sequence of wire states.

According to one embodiment of the present disclosure, a method for use in a physical layer circuit at a transmitter is provided. The method comprises: receiving a plurality of first symbols and converting a symbol value of each of the plurality of first symbols to a corresponding wire state, thereby to generate a plurality of wire states; and receiving the plurality of wire states and serializing the plurality of wire states to provide a sequence of wire states.

According to one embodiment of the present disclosure, a physical layer circuit at a receiver is provided. The physical layer circuit comprises: a serial-to-parallel (S2P) converter and a decoding chain. The S2P converter is coupled to a multi-wire communication link, and arranged receive a sequence of write states transmitted through the multi-wire communication link and deserialize the sequence of write states to provide a plurality of wire states. The decoding chain has a plurality of decoding unit coupled in series and is arranged to receive the plurality of wire states and convert each of the plurality of wire states to a corresponding symbol value, thereby to generate a plurality of first symbols.

According to one embodiment of the present disclosure, a method for use in a physical layer circuit at a receiver is provided. The method comprises: receiving a sequence of write states and deserializing the sequence of write states to provide a plurality of wire states; and receiving the plurality of wire states and converting each of the plurality of wire states to a corresponding symbol value of a symbol, thereby to generate a plurality of first symbols.

According to one embodiment of the present disclosure, a communication system based on a multi-wire communication link is provided. The communication system comprises: a transmitter and a receiver. The transmitter comprises: a controller, a first physical layer circuit and a first interfacing circuit. The controller is arranged to provide a word of data. The first physical layer circuit is coupled to the controller and arranged to generate a sequence of wire states according to the word of data. The first physical layer circuit comprises an encoding chain arranged to convert a plurality of first symbols that are not serialized into a plurality of wire states. The first interfacing circuit is coupled to the first physical layer circuit and the multi-wire communication link and, is arranged to controlling levels of a plurality of wires of the multi-wire communication link according to the sequence of wire states generated by the first physical layer circuit. The receiver comprises a second interfacing circuit, a second physical layer unit and a controller. The second interfacing circuit is coupled to the multi-wire communication link, arranged extract the sequence of wire states from the wires of the multi-wire communication link. The second physical layer unit is coupled to the second interfacing circuit, arranged to reproduce the word of data according the sequence of wire states. The second physical layer unit comprises: a decoding chain arranged to convert a plurality of wire states that are deserialized from the sequence of the wire states, into a plurality of first symbols. The controller is coupled to the second physical layer circuit and arranged to receive and process the word of data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3E illustrates how the encoding architecture of the present disclosure works according to some embodiments of the present disclosure.

FIGS. 4A-4E illustrates how the decoding architecture of the present disclosure works according to some embodiments of the present disclosure.

DETAILED DESCRIPTION

In the following description, numerous specific details are set forth to provide a thorough understanding of embodiments of the disclosure. One skilled in the relevant art will recognize, however, that the disclosure can be practiced without one or more of the specific details, or with other methods, components, materials, etc. In other instances, well-known structures, materials, or operations are not shown or described in detail to avoid obscuring aspects of the disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Further, it will be understood that when an element is referred to as being "connected to" or "coupled to" another element, it may be directly connected to or coupled to the other element, or intervening elements may be present.

Figure 1:
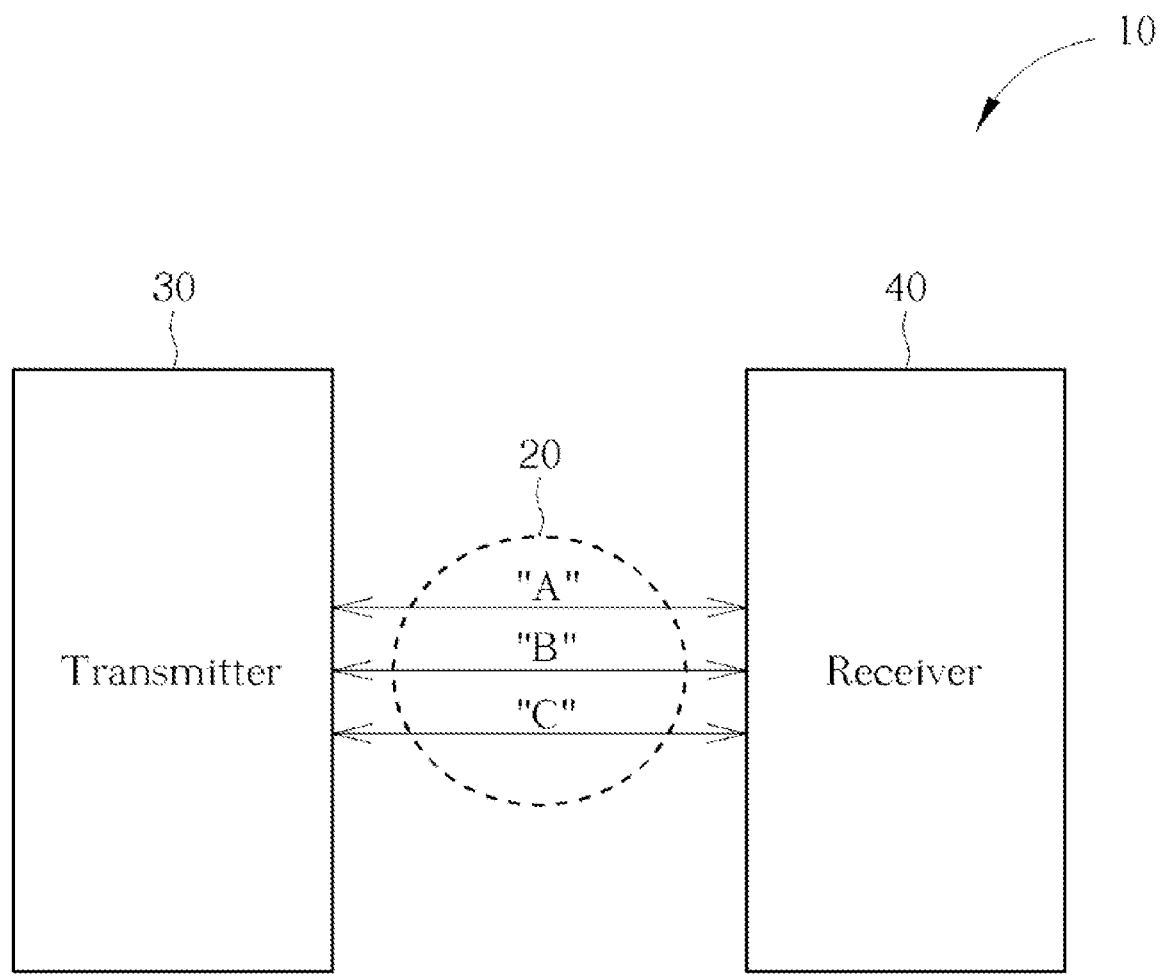
FIG. 1 illustrates an overview of a communication system according to one embodiment of the present disclosure.

FIG. 1 illustrates an overview of a communication system according to one embodiment. The communication system 10 comprises a transmitter 30 and a receiver 40, where the transmitter 30 communicates with the receiver 40 through a multi-wire communication link 200. The multi-wire communication link may comprise three wires A, B, and C, and these three wires form a lane between the transmitter 30 and the receiver 40. The communication system 10 of the present disclosure is adaptable to a MIPI C-PHY configuration. For MIPI C-PHY configuration, signaling on the wires A, B and C comprises six wire states, which are called: +x, −x, +y, −y, +z, and −z.

Figure 2:
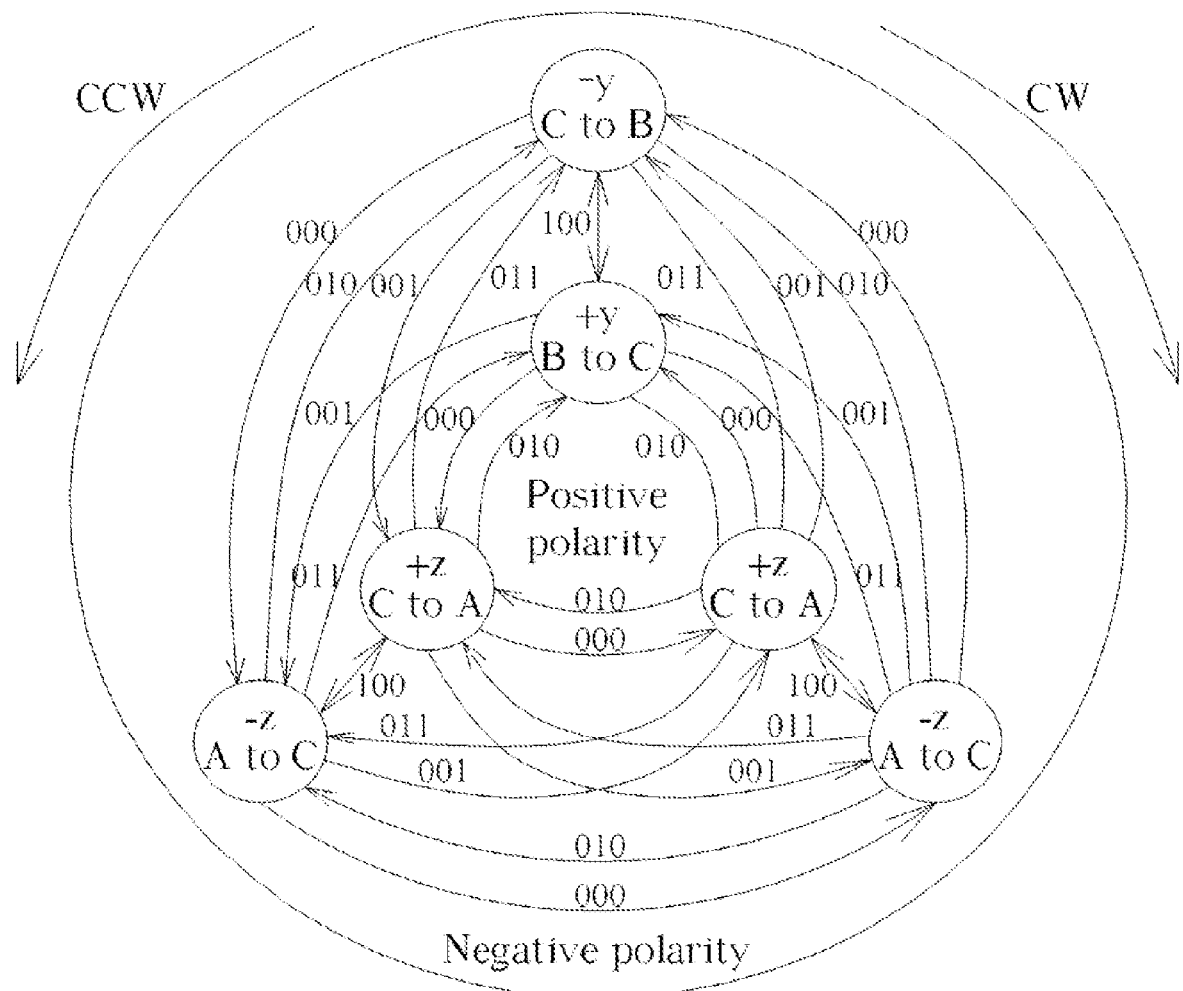
FIG. 2 illustrates a state diagram regarding wire states and possible transitions in MIPI C-PHY interface.

FIG. 2 illustrates a state diagram showing six wire states: +x, −x, +y, −y, +z, and −z and five possible transitions from a present wire state to a next wire state. A symbol value of the symbol transmitted through the multi-wire communication link 200 is correspondingly defined by the change in wire state values from one unit interval to the next. Typically, seven consecutive symbols are used to transmit 16 bits of information in the MIPI C-PHY configuration.

Figure 3A:
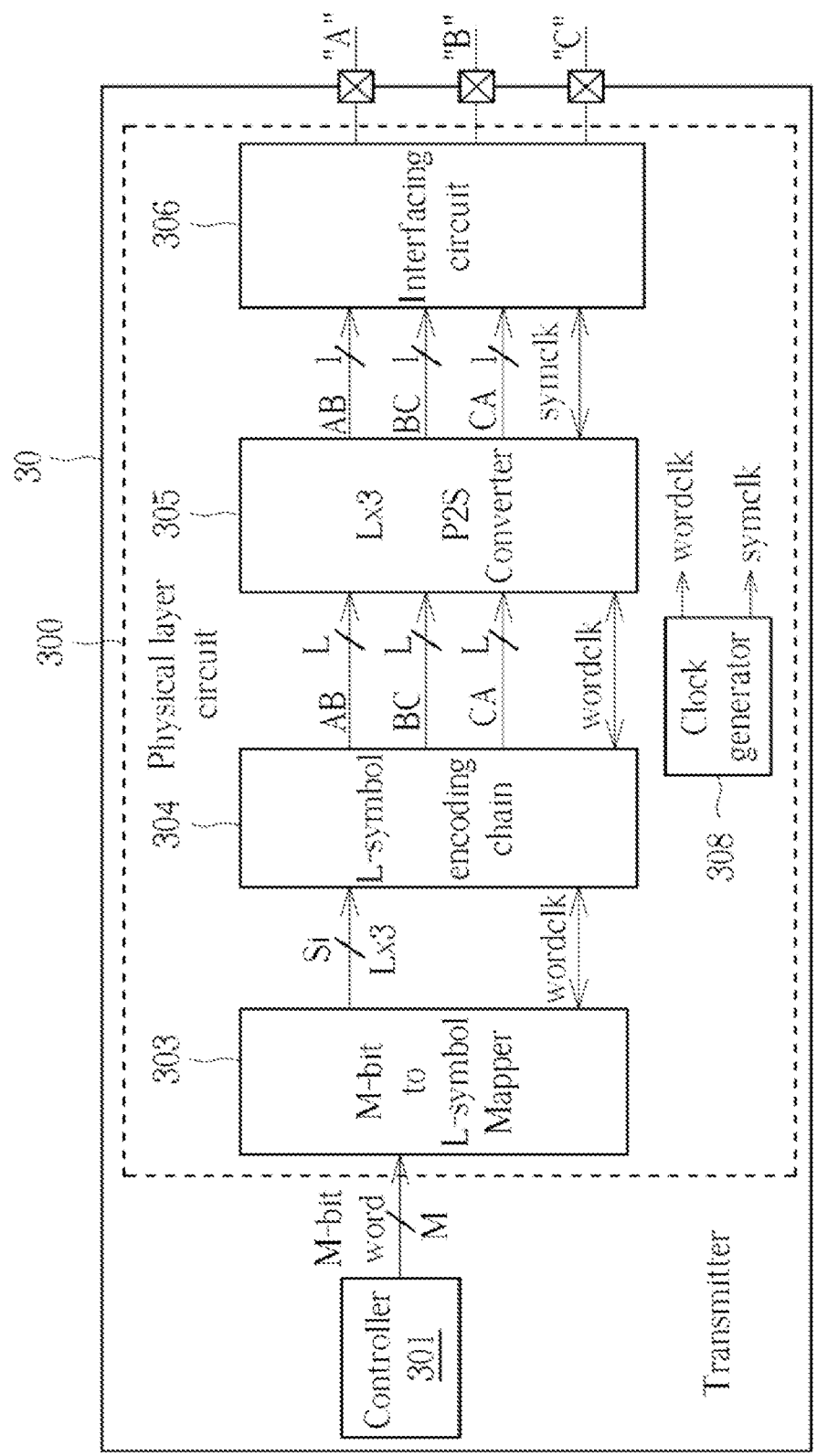

FIG. 3A illustrates a transmitter implemented based on an encoding architecture employed in the transmitter 30 shown in FIG. 1 according to one embodiment of the present disclosure. The transmitter 30 comprises a controller 301 and a physical layer circuit 300. The controller 301 could be embodied by or otherwise included within a machine, such as a general purpose processor, a digital signal processor (DSP), an application specific integrated circuit (ASIC), a field programmable gate array (FPGA) or other programmable logic device or any combination thereof designed and programmed to perform or cause the performance of the functions described herein. The controller 301 is operable to provide a word of data. In some embodiments, the controller 301 provides an M-bit word of data.

The physical layer circuit 300 comprises an M-bit to L-symbol mapper 303, an L-symbol encoding chain 304, an L×3 parallel-to-serial (P2S) converter 305 and an interfacing circuit 306. The M-bit to L-symbol mapper 303 is operable to receive the M-bit word of data from the controller 301 and map the M-bit word of data to L symbols, where "M" could be an integer and any of multiples of 16, and "L" could be an integer and any of multiples of 7. For example, the mapper 303 is operable to receive a 16-bit word and map the received 16-bit word to 7 symbols according to a mapping function defined in MIPI C-PHY specification. Alternatively, the M-bit to L-symbol mapper 303 may map, a 32-bit word to 14 symbols, a 48-bit word to 21 symbols, a 64-bit word to 28 symbols, and so on.

Furthermore, in some embodiments, each symbol comprises 3-bit symbol value. Each symbol is comprised of a flip, rotate and polarity bit, wherein each symbol value Si could be [Flip[i], Rotation[i], Polarity[i]].

The L-symbol encoding chain 304 is operable to encode the L symbols outputted by the M-bit to L-symbol mapper 303, which convert each symbol value Si to a wire state Wi (e.g. +x, −x, +y, −y, +z, and −z, as clearly defined in MIPI C-PHY specification). The wire state Wi is also comprised of 3-bit information [AB, BC, CA] to respectively indicate signaling state for wires A, B and C. The L-symbol encoding chain 304 encodes the symbol according to an encoding scheme illustrated in FIG. 3B, which is also defined in MIPI C-PHY specification.

Figure 3C:
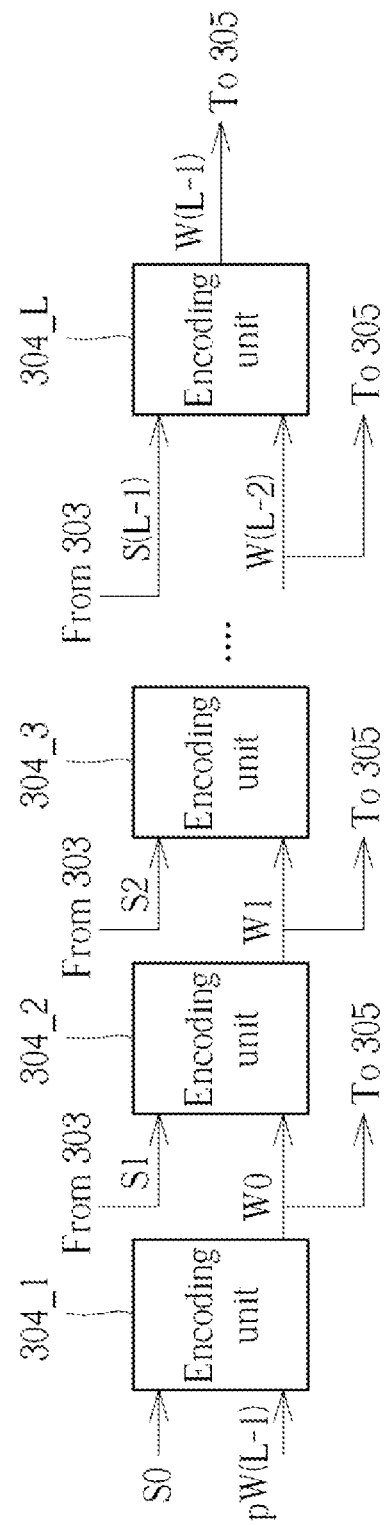

FIG. 3C illustrates a detailed implementation of the L-symbol encoder chain 304 shown in FIG. 3A according to one embodiment of the present disclosure. Referring to FIG. 3C and also to FIG. 3A, the L-symbol encoding chain 304 may comprise a plurality of encoding units 304_1-304_L coupled in series. The encoding units 304_1-304_L are arranged to receive the L symbols respectively, and convert respective symbol values of the L symbols to a plurality of wire states W0-W(L−1) respectively. One of the encoding units 304_1-304_L can be configured to convert a symbol value of a corresponding symbol according to a wire state provided by another of the encoding units 304_1-304_L. For example, each of the encoding units 304_1-304_L is operable to convert a symbol value Si of a symbol according to the symbol value Si and a previous wire state W(i−1) outputted by a previous one of the encoding units 304_1-304_L according to the encoding scheme illustrated in FIG. 3B, thereby to derive a present wire state W(i).

In the present embodiment, the encoding unit 304_2 is operable to encode according to a symbol value S1 of a second one of symbols outputted by the M-bit to L-symbol mapper 303 and a previous wire state W0 generated by the previous the encoding unit 304_1, thereby to derive a present wire state W1. The encoding unit 304_3 is operable to encode according to a symbol value S2 of a third one of symbols outputted by the M-bit to L-symbol mapper 303 and a previous wire state W1 generated by the previous encoding unit 304_2, thereby to derive a present wire state W2. Please note that, for the encoding unit 304_1, it encodes according to a symbol value S0 of a first one of symbols outputted by the M-bit to L-symbol mapper 303 and a previous wire state pW(L−1) to derive a present wire state W0, wherein the wire state pW(L−1) is outputted by the last one encoding unit 304_L during an encoding operation with respect to a word of data that is previously provided by the controller 301. In addition, the wire states W0-W(L−1) that are respectively generated by the encoding units 304_1-304_L, are further outputted to the L×3 P2S converter 305.

Figure 3D:
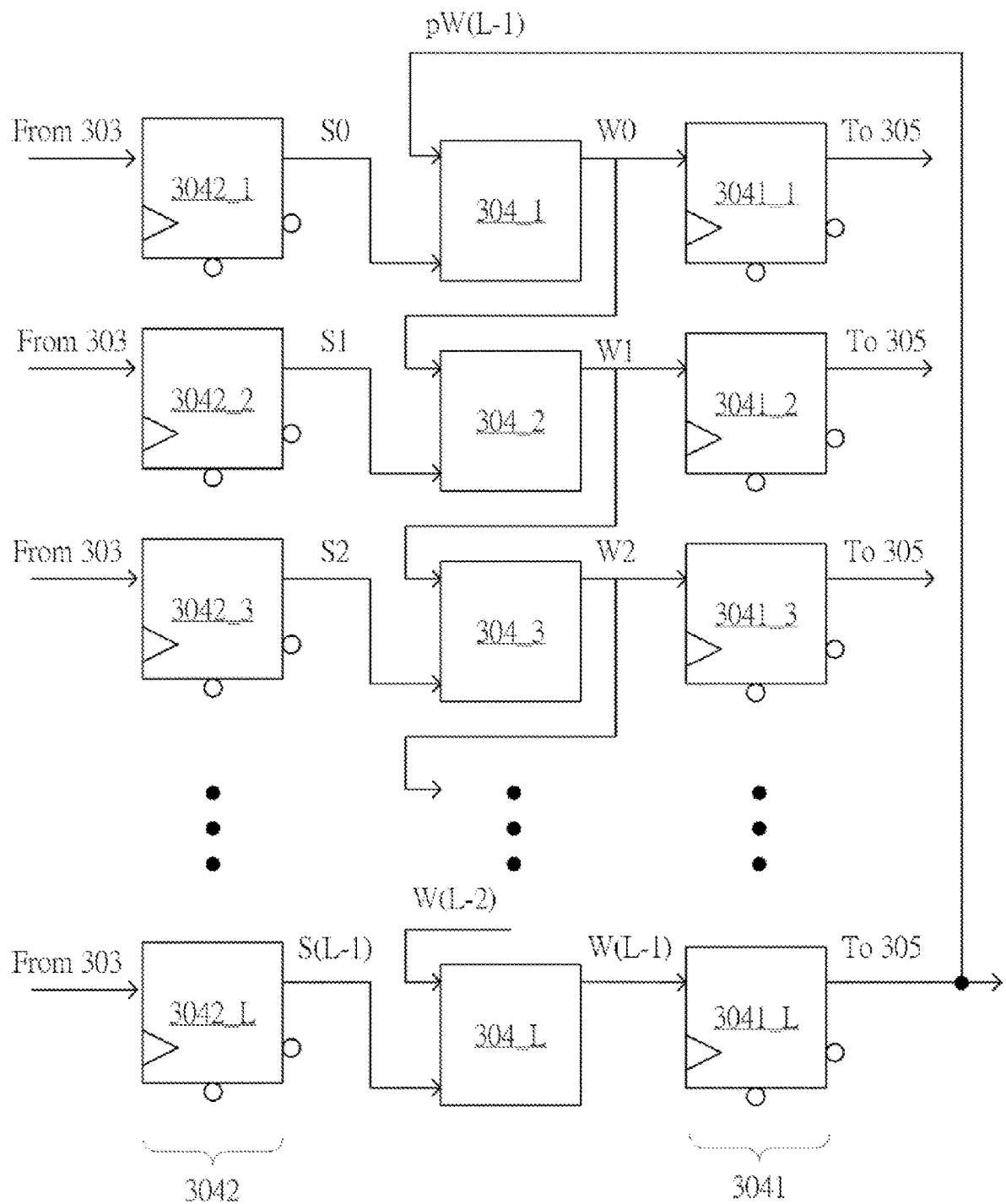

In some embodiments, one or more flip-flops could be coupled between the L-symbol encoding chain 304 and the P2S converter 305 for performing timing alignment according to a clock signal. For example, the encoding units 304_1-304_L can be configured to generate the wire states W0-W(L−1) within a clock cycle of the clock signal. Referring to FIG. 3D and also to FIG. 3A, the physical layer circuit 300 can further include a flip-flop circuit 3041 disposed between the L-symbol encoding chain 304 and the L×3 P2S converter 305, wherein the flip-flop circuit 3041 includes a plurality of flip-flops 3041_1-3041_L. In the present embodiment, the flip-flops 3041_1-3041_L are coupled to the encoding units 304_1-304_L to receive the wire states W0-W(L−1) respectively. Also, the flip-flops 3041_1-3041_L can be configured to output the wire states W0-W(L−1) according to a clock signal, i.e. a word clock signal wordclk in the present embodiment. As a result, the encoding units 304_1-304_L can be configured to generate the wire states W0-W(L−1) within a clock cycle of the word clock signal wordclk. The word clock signal wordclk may correspond to a transmission duration of the word to data. In some embodiments, the word clock signal wordclk could be a "High-Speed Transmit Word Clock "*TxWordClkHS"" as defined in MIPI C-PHY specification, which used to synchronize PPI signals in the high-speed transmit clock domain. However, this is not intended to be a limitation of the present disclosure.

In the present embodiment, the flip-flop 3041_L can be coupled between the encoding unit 304_1 and the encoding unit 304_L. The encoding unit 304_1 can convert the symbol value S0 according to a wire state provided by the encoding unit 304_L, which is sent to the encoding unit 304_1 through the flip-flop 3041_L. For example, the flip-flop 3041_L can be arranged to output the wire state pW(L−1) in a clock cycle of the clock signal wordclk before the flip-flops 3041_1-3041_L output the wire states W0-W(L−1) in another clock cycle of the clock signal wordclk. As a result, the encoding unit 304_1 can derive the present wire state W0 by encoding the symbol value S0 according to the previous wire state pW(L−1), which is outputted by the encoding unit 304_L during an encoding operation with respect to a word of data that is previously provided by the controller 301.

Additionally or alternatively, the physical layer circuit 300 can further include a flip-flop circuit 3042 disposed between the M-bit to L-symbol mapper 303 and the L-symbol encoding chain 304, wherein the flip-flop 3042 includes a plurality of flip-flops 3042_1-3042_L. In the present embodiment, the flip-flops 3042_1-3042_L, coupled to the encoding units 304_1-304_L respectively, can be configured to provide the L symbols to the encoding units 304_1-304_L, respectively. For example, the flip-flops 3042_1-

3042_L can output the symbol values S0-S(L−1) to the encoding units 304_1-304_L according to the clock signal used for clocking the flip-flops 3041_1-3041_L, i.e. the word clock signal wordclk in the present embodiment. As a result, the encoding units 304_1-304_L can be configured to receive the symbol values S0-S(L−1) within a clock cycle of the word clock signal wordclk. It is worth noting that, with the use of the flip-flops 3042_1-3042_L and the flip-flops 3041_1-3041_L, the physical layer circuit 300 may perform timing alignment for an encoding operation of the L-symbol encoding chain 304.

Referring again to FIG. 3A, in some embodiments, circuitry of the physical layer circuit 300 could be divided into at least a physical coding sublayer (PCS) part and a physical medium attachment (PMA) part. In one embodiment, the L-symbol encoding chain 304 may be disposed in the PCS part while the L×3 P2S converter 305 may be disposed in PMA part.

The L×3 P2S converter 305 is operable to serialize the L wire states W0-W(L−1) generated by the L-symbol encoding chain 304 to output a sequence of 3-bit wire states WS according to the word clock signal wordclk. By way of example but not limitation, the L×3 P2S converter 305 can be coupled to the encoding units 304_1-304_L shown in FIG. 3C to receive the wire states W0-W(L−1) from the encoding units 304_1-304_L. As another example, the L×3 P2S converter 305 can be coupled to the flip-flops 3041_1-3041_L shown in FIG. 3D to receive the wire states W0-W(L−1) from the encoding units 304_1-304_L through the flip-flops 3041_1-3041_L.

The interfacing circuit 306 is arranged to driving/controlling signal levels on the wires A, B, C according to the sequence of 3-bit wire states WS with a symbol clock signal symclk that corresponds to transmission duration of one symbol. In some embodiments, the symbol clock signal symclk could be a "Lane High-Speed Transmit Symbol Clock "TxSymbolClkHS"" as defined in MIPI C-PHY specification, which provides the timing used to transmit high-speed symbol data over the lane interconnect.

In some embodiments, the physical layer circuit 300 further comprises a clock generator 308, which can be implemented with a phase lock loop (PLL). The clock generator 308 is operable to generate the word clock signal wordclk and the symbol clock signal symclk, which correspond to transmission durations of one word and one symbol, respectively. In the case where the "M" is 16 and "L" is 7, the frequency of the word clock signal wordclk would be 1/7 of that of the symbol clock signal symclk since one word is mapped to 7 symbols. In the case where the "M" is 32 and "L" is 14, the frequency of the word clock signal wordclk would be 1/14 of that of the symbol clock signal symclk since one word is mapped to 14 symbols.

For data transmission between elements in the physical layer circuit 300, data buses of different widths are applied due to parallel to serial conversion. Between the controller 301 and the M-bit to L-symbol mapper 303, the data bus would be M bits wide. Between the M-bit to L-symbol mapper 303 and the L-symbol encoding chain 304, the data bus would L×3 bits wide. Between the L-symbol encoding chain 304 and the L×3 P2S converter 305, the data bus would L×3 bits wide. Between the L×3 P2S converter 305 and the interfacing circuit 306, the data bus would 3 bits wide.

According to various embodiments of the present disclosure, an N-symbol encoding chain may be utilized to encode more or fewer symbols than L symbols outputted by the M-bit to L-symbol mapper 303 during a cycle of encoding operation. In such embodiments, there would be some modifications made to the physical layer circuit 300 as mentioned above. Please refer to FIG. 3E for further details.

Figure 3E:
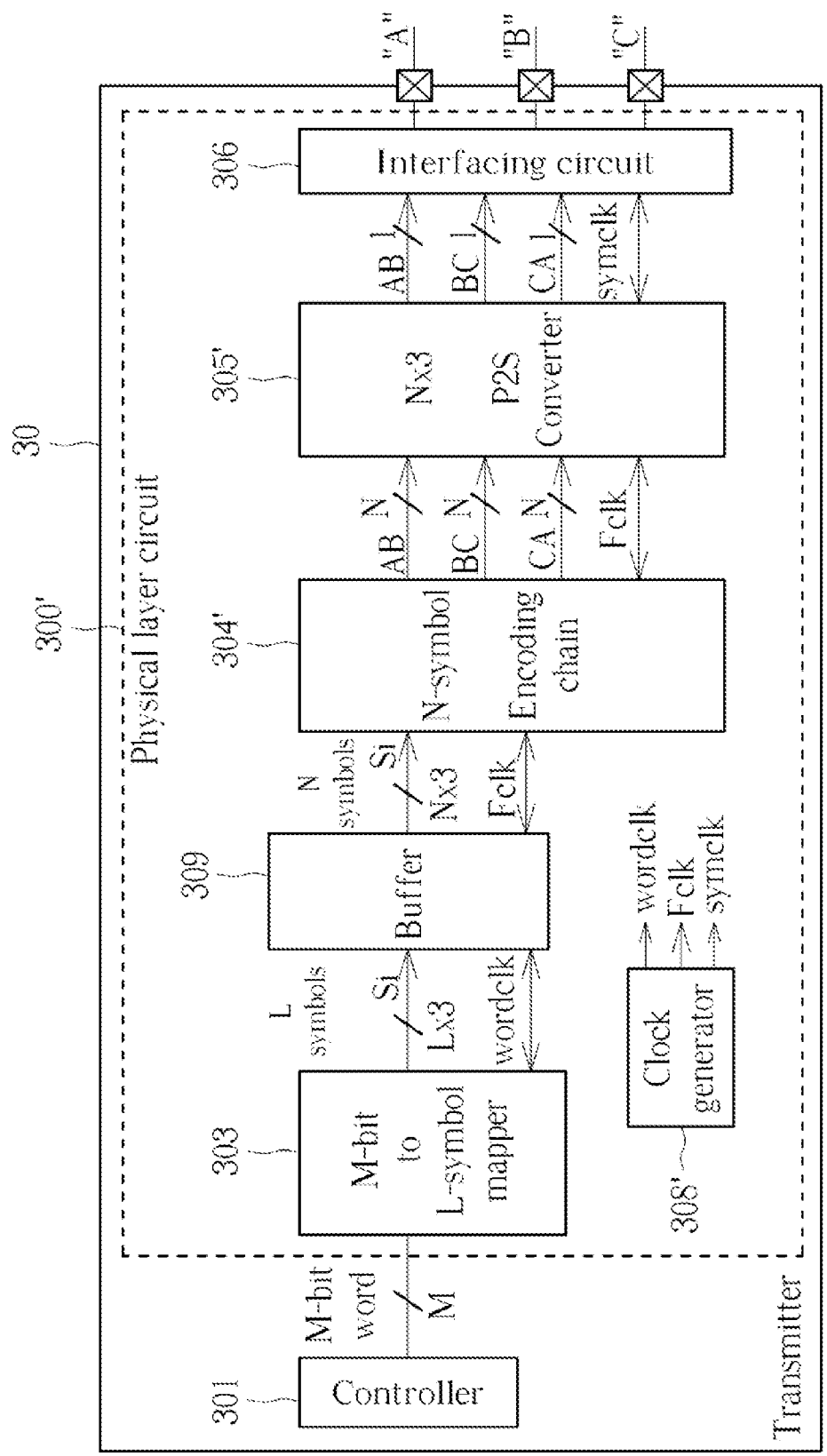

As shown in FIG. 3E, a physical layer circuit 300' comprises an M-bit to L-symbol mapper 303, a buffer 309, an N-symbol encoding chain 304', an N×3 P2S converter 305' and an interfacing circuit 306. As mentioned above, the M-bit to L-symbol mapper 303 is operable to receive M-bit word of data from the controller 301 and map the M-bit word of data to L symbols as mentioned above. Since the N-symbol encoding chain 304' is operable to encode more or fewer symbols than L symbols outputted by the M-bit to L-symbol mapper 303 during a cycle of encoding operation, a buffer is provided to solve asynchronous operations therebetween. Hence, the buffer 309, which can be implemented by a first-in/first-out (FIFO) buffer, is utilized to store every L symbols outputted by the M-bit to L-symbol mapper 303 according to a clock signal, i.e. the word clock signal wordclk in the present embodiment. The buffer 309 can be configured output the L symbols according to another clock signal. For example, during each cycle of encoding operation, the N-symbol encoding chain 304' fetches N symbols from the buffer 309 according to a fractional clock signal Fclk having a frequency different from that of the word clock signal wordclk.

In the present embodiment, the buffer 309 is configured to store L symbols in each cycle of the word clock signal wordclk, and the buffer 309 is configured to output N symbols in each cycle of the fractional clock signal Fclk. As a result, the frequency of the fractional clock signal Fclk may be 1/N of that of the symbol clock signal symclk. A ratio of the frequency of the fractional clock signal Fclk to the frequency of the word clock signal wordclk can be determined according to a ratio of N to L.

Operations and principles of the N-symbol encoding chain 304' is similar to the L-symbol encoding chain 304 described with reference to FIG. 3A to FIG. 3D, which are both operable to encode the symbols outputted by the M-bit to L-symbol mapper 303 and convert each symbol value Si to a wire state Wi as what is defined in MIPI C-PHY specification. The difference between the N-symbol encoding chain 304' and the L-symbol encoding chain 304 described above is the number of encoding units included therein. As shown in FIG. 3C, the L-symbol encoding chain 304 utilizes L encoding units 304_1-304_L to sequentially encode L symbols to L wire states. In contrast to this, the N-symbol encoding chain 304' shown in FIG. 3E can utilize N encoding units coupled in series, which can be implemented according to one or more of the encoding units 304_1-304_L shown in FIG. 3C, to sequentially encode N symbols to N wire states.

Similarly, there could be one or more flip-flops coupled between the FIFO buffer 309 and the N-symbol encoding chain 304', such as N flip-flops implemented according to one or more of the flip-flops 3042_1-3042_L shown in FIG. 3D. In some embodiments, there could be one or more flip-flops coupled between the N-symbol encoding chain 304' and the N×3 P2S converter 305', such as N flip-flops implemented according to one or more of the flip-flops 3041_1-3041_L shown in FIG. 3D. With the use of the N flip-flops coupled between the FIFO buffer 309 and the N-symbol encoding chain 304', and the N flip-flops coupled between the N-symbol encoding chain 304' and the N×3 P2S converter 305', the physical layer circuit 300' may perform timing alignment for an encoding operation of the N-symbol encoding chain 304' according to the fractional clock signal Fclk. However, this is not intended to be a limitation of the present disclosure.

The N×3 P2S converter 305' is operable to serialize the N wire states W0-W(N−1) generated by the N-symbol encoding chain 304' to output a sequence of 3-bit wire states WS, wherein the N×3 P2S converter 305' serializes the N wire states W0-W(N−1) according to the fractional clock signal Fclk. The interfacing circuit 306 is arranged to driving/controlling signal levels on the wires A, B, C according to the sequence of wire states WS with the symbol clock signal symclk that corresponds to transmission duration of one symbol.

In some embodiments, the physical layer circuit 300' further comprises a clock generator 308'. The clock generator 308' is operable to generate the word clock signal wordclk which corresponds to transmission duration of one word and the symbol clock signal symclk which correspond to transmission duration of one symbol. Additionally, the clock generator 308' is also arranged to generate the fractional clock signal Fclk. In one embodiment, the clock generator 308' could be implemented with a PLL. The frequency of the fractional clock signal Fclk would be 1/N of that of the symbol clock signal symclk, while the frequency of the word clock signal wordclk depends on "M" and "L". In the case where the "M" is 16 and "L" is 7, the frequency of the word clock signal wordclk would be 1/7 of that of the symbol clock signal symclk. In the case where the "M" is 32 and "L" is 14, the frequency of the word clock signal wordclk would be 1/14 of that of the symbol clock signal symclk.

For data transmission between elements in the physical layer circuit 300', data buses of different widths are applied due to parallel to serial conversion and the asynchronous operations. Between the controller 301 and the M-bit to L-symbol mapper 303, the data bus would be M bits wide. Between the M-bit to L-symbol mapper 303 and the buffer 309, the data bus would be L×3 bits wide. Between the buffer 309 and the N-symbol encoding chain 304', the data bus would be N×3 bits wide. Between the N-symbol encoding chain 304' and N×3 P2S converter 305', the data bus would be N×3 bits wide. Between the N×3 P2S converter 305' and the interfacing circuit 306, the data bus would 3 bits wide.

Furthermore, operation of the physical layer circuit 300 and 300' could be summarized into following step: receiving a plurality of first symbols and converting a symbol value of each of the plurality of first symbols to a corresponding wire state, thereby to generate a plurality of wire states; and receiving the plurality of wire states and serializing the plurality of wire states to provide a sequence of wire states.

Please note that the above-mentioned step of receiving the plurality of first symbols and converting the symbol value of each of them to the corresponding wire state may rely on an encoding chain having a plurality of encoding units, such as the encoding chain 304 or the encoding chain 304' described above with reference to FIG. 3A to FIG. 3E. Further details and/or sub-steps based on operations of the physical layer circuits 300 and 300' shown in FIG. 3A to FIG. 3E are omitted here for sake of brevity.

Figure 4A:
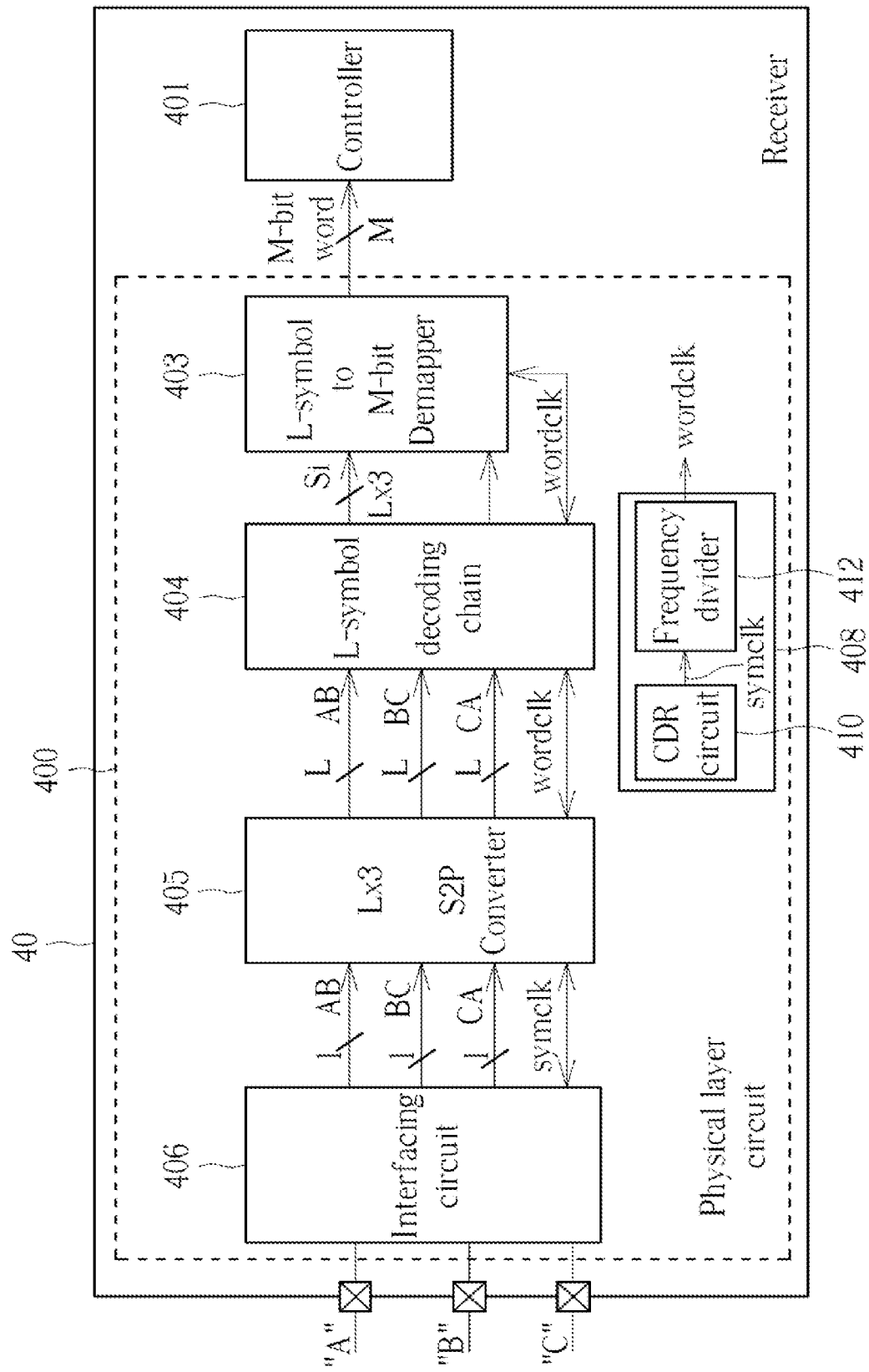

FIG. 4A illustrates a receiver implemented based on a decoding architecture employed in the receiver 40 shown in FIG. 1 according to one embodiment of the present disclosure. The receiver 40 of this embodiment could be used in communication with the transmitter 30 of the above-mentioned embodiment. The receiver 40 comprises a controller 401 and a physical layer circuit 400. The physical layer circuit 400 is operable to receive signals transmitted on the wires A, B, C, which correspond to the word of data provided by the controller 301 shown in FIG. 3A or FIG. 3E. Based on a series of operations performed by components in the physical layer circuit 400, a reproduced version of the word of data would be provided to the controller 401. The controller 401 is operable to process the word of data. The controller 401 could be embodied by or otherwise included within a machine, such as a general purpose processor, a digital signal processor (DSP), an application specific integrated circuit (ASIC), a field programmable gate array (FPGA) or other programmable logic device or any combination thereof designed and programmed to perform or cause the performance of the functions described herein.

The physical layer circuit 400 comprises an interfacing circuit 406, an L×3 serial to parallel (S2P) converter 405, an L-symbol decoding chain 404, and an L-symbol to M-bit demapper 403. The interfacing circuit 406 is arranged to extract a sequence of 3-bit wire states WS from the wires, A, B and C according to a symbol clock signal symclk which corresponds to a transmission duration of one symbol. In some embodiments, the symbol clock signal symclk in the physical layer circuit 400 could be a "High-Speed Receive symbol Clock "RxSymbolClkHS"". However, this is not intended to be a limitation of the present disclosure.

The L×3 S2P converter 405 is operable to deserialize the sequence of 3-bit wire states WS to output L wire states W0-W(L−1) according to the symbol clock signal symclk. The L-symbol decoding chain 404 is operable to decode the L wire states W0-W(L−1), which convert each wire state Wi to a symbol value Si. As mentioned above, the wire state Wi could be one of the six wire states: +x, −x, +y, −y, +z, and −z, as defined in MIPI C-PHY specification and represented by 3-bit information [AB, BC, CA]. Each symbol is comprised of a flip, rotate and polarity bit and each symbol value Si could be represented by [Flip[i], Rotation[i], Polarity[i]]. The L-symbol decoding chain 404 decodes the wire state according to a decoding scheme illustrated in FIG. 4B, which is defined in MIPI C-PHY specification.

In some embodiments, circuitry of the physical layer circuit 400 could be divided into at least a PCS part and a PMA part. For example, the L-symbol decoding chain 404 may be disposed in the PCS part while the L×3 S2P converter 405 may be disposed in PMA part.

Figure 4C:
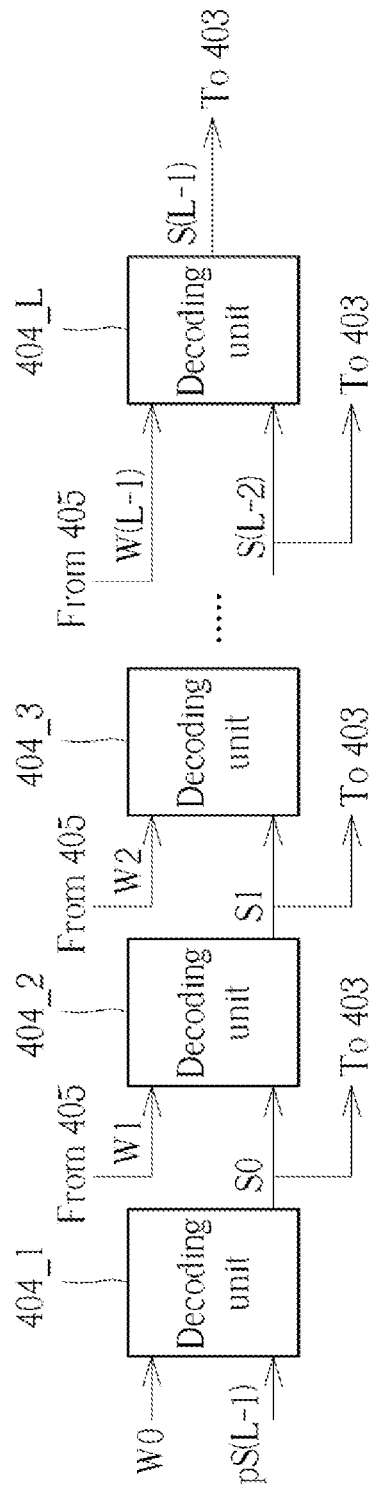

FIG. 4C illustrates a detailed implementation of the L-symbol decoder chain 404 shown in FIG. 4A according to one embodiment of the present disclosure. Referring to FIG. 4C and also to FIG. 4A, the L-symbol decoding chain 404 comprises L decoding units 404_1-404_L coupled in series. The decoding units 404_1-404_L are arranged to receive the wire states W0-W(L−1) respectively, and convert the wire states W0-W(L−1) to respective symbol values S0-S(L−1) of L symbols respectively. One of the decoding units 404_1-404_L is configured to convert a corresponding wire state according to a wire state provided by another of the decoding units 404_1-404_L. For example, each of the decoding units 404_1-404_L is operable to convert a present wire state Wi, that is received by the physical layer circuit 400 during an interval N, according to the present wire state Wi and a previous wire state W(i−1), that is received by the physical layer circuit 400 during another interval (N−1) such as an immediately preceding interval, based on the decoding scheme illustrated in FIG. 4B.

In the present embodiment, the decoding unit 404_2 is operable to decode according to a present wire state W1 outputted by the L×3 S2P converter 405 (e.g. the wire state received by the L×3 S2P converter 405 during the interval N) and a previous wire state W0 (e.g. the wire state received by the L×3 S2P converter 405 during the interval N−1 immediately before the interval N). The decoding unit 404_3 is operable to decode according to a wire sate W2 outputted by the L×3 S2P converter 405 (e.g. the wire state received by the L×3 S2P converter 405 during an interval N+1) and the previous wire state W1 (e.g., the wire state received by the L×3 S2P converter 405 during the interval N immediately before the interval N+1). In other words, one of the decoding units 404_1-404_L can convert a corresponding wire state according to a corresponding first wire state outputted to another of the encoding units 404_1-404_L.

Please note that, for the decoding unit 404_1, it decodes according to a wire state W0 of the wire states outputted by the L×3 S2P converter 405 and a wire state pW(L−1), wherein the wire state pW(L−1) is received during an decoding operation with respect to a word of data that is previously received by the physical layer circuit 400. In addition, the symbol values S0-S(L−1) that are respectively generated by the decoding unit 404_1-404_L, are further outputted to the L-symbol to M-bit demapper 403.

In some embodiments, one or more flip-flops could be coupled between the L×3 S2P converter 405 and the L-symbol decoding chain 404 for performing timing alignment according to a clock signal. For example, the decoding units 404_1-404_L can be configured to generate the L symbols within a clock cycle of the clock signal. Referring to 4D and also to FIG. 4A, the physical layer circuit 400 can further include a plurality of flip-flops 4041_1-4041_L and 4042, The flip-flops 4041_1-4041_L, disposed between the L×3 S2P converter 405 and the L-symbol decoding chain 404, are arranged to output the wire states W0-W(L−1) according to a clock signal, i.e. a word clock signal wordclk in the present embodiment. The word clock signal wordclk may correspond to transmission duration of one word. In some embodiments, the word clock signal wordclk in the physical layer circuit 400 could be a "High-Speed Receive Word Clock "RxWordClkHS"". However, this is not intended to be a limitation of the present disclosure.

The flip-flop 4042 is coupled between the flip-flop 4041_L and the decoding unit 404_1. A wire state provided by the flip-flop 4041_L can be sent to the decoding unit 404_1 through the flip-flop 4042. As a result, the decoding unit 404_1 can be configured to convert a corresponding wire state according to a wire state provided for the decoding unit 404_L, which is coupled to the flip-flop 4041_L. For example, the decoding unit 404_1 can be configured to convert the wire state W0 according to the wire state pW(L−1) provided by the flip-flop 4041_L through the flip-flop 4042, wherein the wire state pW(L−1) is provided for the decoding unit 404_L before the wire state W(L−1) is outputted from the flip-flop 4041_L. The decoding unit 404_1 can derive the symbol value S0 by decoding the wire state W0 according to the wire state pW(L−1), which is received during a decoding operation with respect to a word of data that is previously received by the physical layer circuit 400.

In some embodiments where the flip-flops 4041_1-4041_L are clocked by a same clock signal, i.e. the word clock signal wordclk in the present embodiment, the flip-flop 4042 is arranged to send the wire state pW(L−1) to the decoding unit 404_L in a clock cycle of the word clock signal wordclk before the flip-flops 4041_1-4041_L are arranged to output the wire states W0-W(L−1) in another clock cycle of the word clock signal wordclk. Additionally or alternatively, the decoding units 404_1-404_L can be configured to generate the symbols S0-S(L−1) within a clock cycle of the word clock signal wordclk.

In some embodiments, the physical layer circuit 400 can further include a plurality of flip-flops 4043_1-4043_L, which are disposed between the L-symbol decoding chain 404 and the L-symbol to M-bit 403 for performing timing alignment according to a clock signal. For example, the flip-flops 4043_1-4043_L can be coupled to the decoding units 404_1-404_L to receive the symbols S0-S(L−1) respectively. Also, the flip-flops 4043_1-4043_L can be arranged to output the symbols S0-S(L−1) according to a clock signal used for clocking the flip-flops 4041_1-4041_L, i.e. the word clock signal wordclk in the present embodiment. With the use of the flip-flops 4042_1-4042_L and the flip-flops 4043_1-4043_L, the physical layer circuit 400 may perform timing alignment for a decoding operation of the L-symbol decoding chain 404.

Referring again to FIG. 4A, the L-symbol to M-bit demapper 403 is operable to receive the symbol values S0-S(L−1) of L symbols from the L-symbol decoding chain 404 and de-map the symbol values S0-S(L−1) of the L symbols to an M-bit word of data. For example, the L-symbol to M-bit demapper 403 is operable to receive symbol values S0-S6 of 7 symbols from the L-symbol decoding chain 404, and de-map the received symbol values S0-S6 of 7 symbols to a 16-bit word according to a de-mapping function defined in MIPI C-PHY specification. Alternatively, the L-symbol to M-bit mapper 403 may map, 14 symbols to a 32-bit word, 21 symbols to a 48-bit word, 28 symbols to a 64-bit word, and so on. After de-mapping, the word of data outputted by the L-symbol to M-bit mapper 403 will be sent to the controller 401

The physical layer circuit 400 further comprises a clock recovery device 408. The clock recovery device 408 is operable to generate the word clock signal wordclk which corresponds to transmission duration of one word and the symbol clock signal symclk which correspond to transmission duration of one symbol. In one embodiment, the clock recovery device 408 comprises a clock recovery circuit 410 and a frequency divider 412. The clock recovery circuit 410 is arranged to recover the symbol clock symclk signal embedded in signals received on wires A, B and C based on clock recovery techniques. The frequency divider 412 receives the symbol clock signal symclk and accordingly generates the word clock signal wordclk by performing frequency dividing operation on the symbol clock signal symclk. The frequency of the word clock signal wordclk depends on "M" and "L". In the case where the "M" is 16 and "L" is 7, the frequency of the word clock signal wordclk would be 1/7 of that of the symbol clock signal symclk since 7 symbols are de-mapped to one word. In the case where the "M" is 32 and "L" is 14, the frequency of the word clock signal wordclk would be 1/14 of that of the symbol clock signal symclk since 14 symbols are de-mapped to one word.

For data transmission between elements in the physical layer circuit 400, data buses of different widths are applied due to serial to parallel conversion. Between the interfacing circuit 406 and the L×3 S2P converter 405, the data bus would 3 bits wide. Between the L×3 S2P converter 405 and the L-symbol decoding chain 404, the data bus would L×3 bits wide. Between the L-symbol decoding chain 404 and the L-symbol to M-bit demapper 403, the data bus would L×3 bits wide. Between the L-symbol to M-bit demapper 403 and the controller 401, the data bus would be M bits wide.

According to various embodiments of the present disclosure, during a cycle of decoding operation an N-symbol decoding chain may be utilized to decode to output more or fewer symbols than L symbols needed by L-symbol to M-bit demapper 403. In such embodiments, there would be some modifications made to the physical layer circuit 400 as mentioned above. Please refer to FIG. 4E for further details.

Figure 4D:
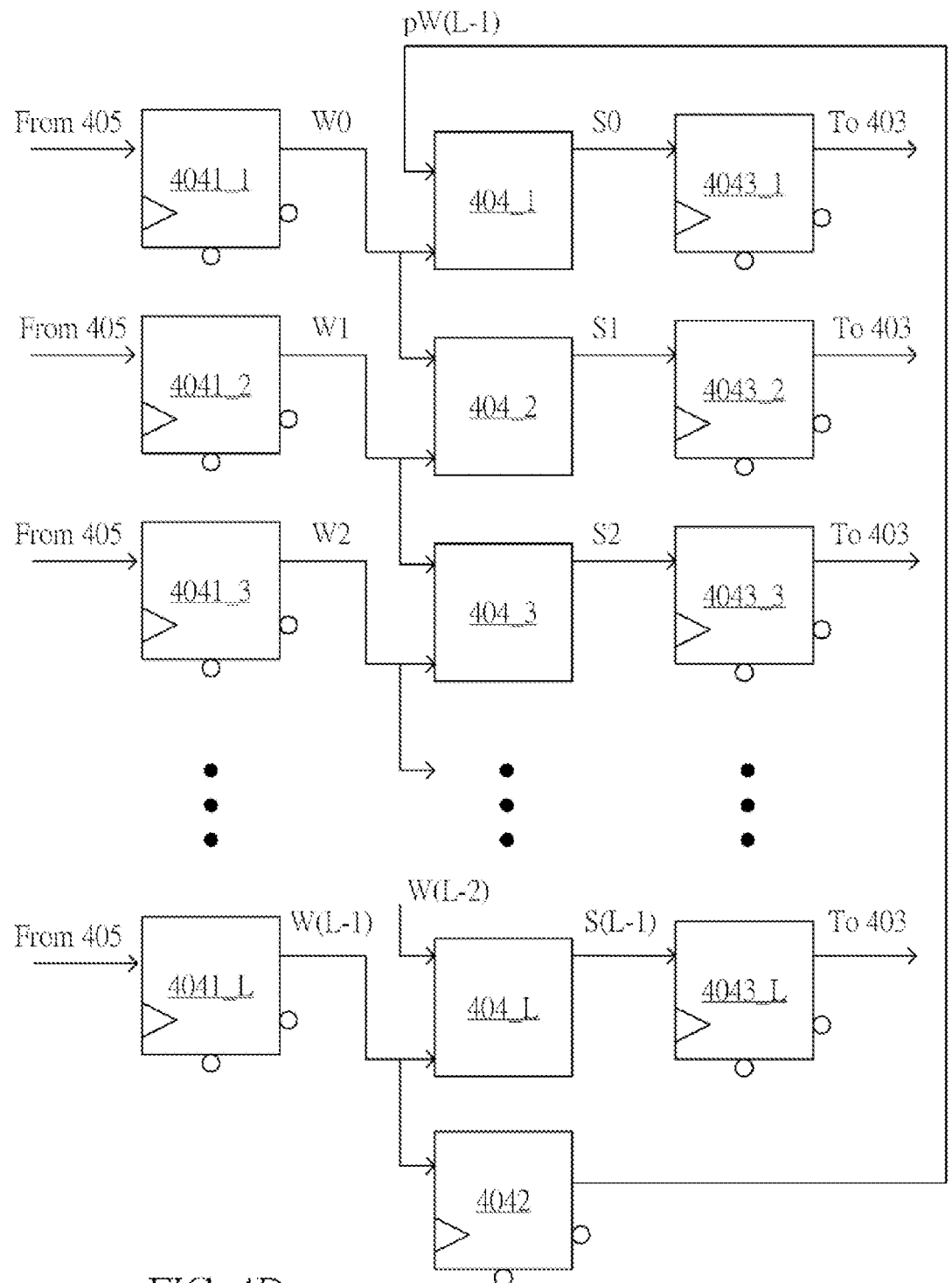
Figure 4E:
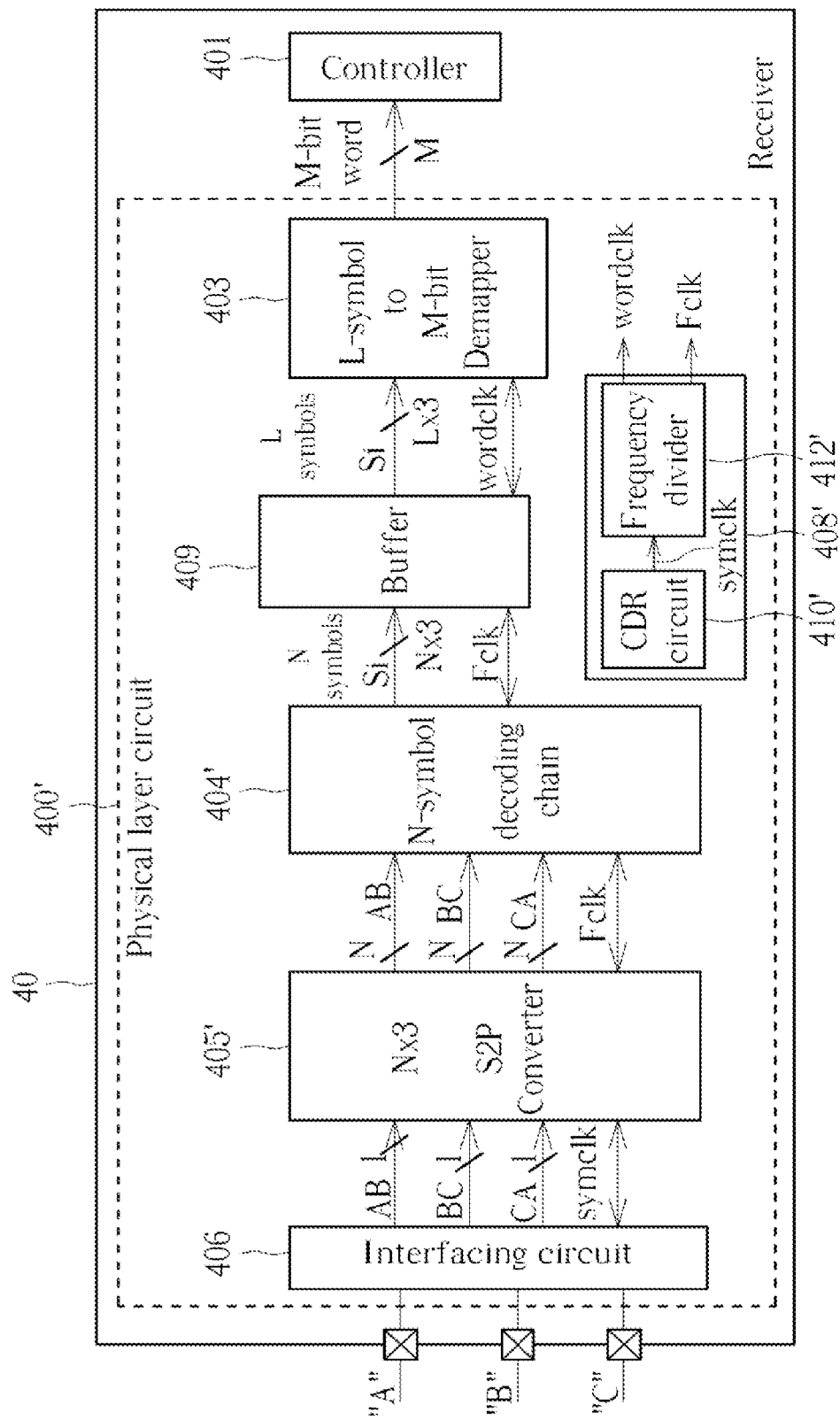

As shown in FIG. 4E, a physical layer circuit 400' comprises an interfacing circuit 406, an N×3 S2P converter 405', an N-symbol decoding chain 404', a buffer 409 and an L-symbol to M-bit demapper 403. The interfacing circuit 406 is arranged to extract a sequence of 3-bit wire states WS from the wires, A, B and C according to the symbol clock signal symclk. The N×3 S2P converter 405' is operable to deserialize the sequence of 3-bit wire states WS to output N wire states W0-W(N−1) for the N-symbol decoding chain 404' during a cycle of decoding operation. The N×3 S2P converter 405' may deserialize the sequence of 3-bit wire states WS according to the symbol clock signal symclk.

Operations and principles of the N-symbol decoding chain 404' is similar to the L-symbol decoding chain 404 described with reference to FIG. 4A to FIG. 4D, which are both operable to decode the wire states outputted by an S2P converter and convert each wire state Wi to a symbol value Si as what is defined in MIPI C-PHY specification. The difference between the N-symbol decoding chain 404' and the L-symbol decoding chain 404 described above is the number of decoding units included therein. As shown in FIG. 4C, the L-symbol decoding chain 404 utilizes L decoding units 404_1-404_L to sequentially decode L wire states to L symbols. In contrast to this, the N-symbol decoding chain 404' shown in FIG. 4E can utilizes N decoding units coupled in series, which can be implemented according to one or more of the encoding units 404_1-404_L shown in FIG. 4C, to sequentially decode N wire states to N symbols.

Similarly, there could be one or more flip-flops coupled between the N-symbol encoding chain 404' and the N×3 S2P converter 405', such as N flip-flips implemented according to one or more of the flip-flips 4042_1-4042_L shown in FIG. 4D. In some embodiments, there could be one or more flip-flops coupled between the buffer 409 (e.g. a FIFO buffer) and the N-symbol decoding chain 404', such as N flip-flips implemented according to one or more of the flip-flips 4043_1-4043_L shown in FIG. 4D. With the use of the N flip-flops coupled between the N-symbol encoding chain 404' and the N×3 S2P converter 405', and the N flip-flops coupled between the buffer 409 and the N-symbol decoding chain 404', the physical layer circuit 400' may perform timing alignment for a decoding operation of the N-symbol decoding chain 404' according to a fractional clock signal Fclk having a frequency different from that of the word clock signal wordclk. For example, the frequency of the fractional clock signal Fclk is 1/N of that of the symbol clock signal symclk. However, this is this is not intended to be a limitation of the present disclosure.

Since the N-symbol decoding chain 404' is operable to output more or fewer symbols than L symbols needed by L-symbol to M-bit demapper 403 during a cycle of de-mapping, a buffer is also needed to solve the asynchronous operations there between. Hence, the buffer 409 (e.g. a FIFO buffer) is utilized to store every N symbols outputted by N-symbol decoding chain 404' according to the fractional clock signal Fclk during a cycle of decoding operation. During a cycle of de-mapping, the L-symbol to M-bit demapper 403 fetches L symbols from the buffer 409 according to the word clock signal wordclk.

In some embodiments, the physical layer circuit 400' further comprises a clock recovery device 408'. The clock recovery device 408' is operable to generate the word clock signal wordclk which corresponds to transmission duration of one word and the symbol clock signal symclk which correspond to transmission duration of one symbol. Additionally, the clock recovery device 408' is also arranged to generate the fractional clock signal Fclk. In one embodiment, the clock recovery device 408' comprises a clock recovery circuit 410' and a frequency divider 412'. The clock recovery circuit 410' is arranged to recover the symbol clock symclk signal embedded in signals received on wires A, B and C based on clock recovery techniques. The frequency divider 412' receives the symbol clock signal symclk and accordingly generates the word clock signal wordclk and the fractional clock signal Fclk by performing frequency dividing operation on the symbol clock signal symclk. The frequency of the fractional clock signal Fclk would be 1/N of that of the symbol clock signal symclk, while the frequency of the word clock signal wordclk depends on "M" and "L". In the case where the "M" is 16 and "L" is 7, the frequency of the word clock signal wordclk would be 1/7 of that of the symbol clock signal symclk. In the case where the "M" is 32 and "L" is 14, the frequency of the word clock signal wordclk would be 1/14 of that of the symbol clock signal symclk.

For data transmission between elements in the physical layer circuit 400', data buses of different widths are applied due to serial to parallel conversion and the asynchronous operations. Between the interfacing circuit 406 and the N×3 S2P converter 405', the data bus would 3 bits wide. Between the N×3 S2P converter 405' and the N-symbol decoding chain 404', the data bus would be N×3 bits wide. Between the N-symbol decoding chain 404' and the buffer 409, the data bus would be N×3 bits wide. Between the buffer 409 and the L-symbol to M-bit demapper 403, the data bus would be L×3 bits wide. Between the L-symbol to M-bit demapper 403 and the controller 401, the data bus would be M bits wide.

Furthermore, operation of the physical layer circuit 400 and 400' could be summarized into following step: receiving a sequence of write states and deserializing the sequence of write states to provide a plurality of wire states; and utilizing receiving the plurality of wire states and converting each of the plurality of wire states to a corresponding symbol value of a symbol, thereby to generate a plurality of first symbols.

Please note that the above-mentioned step of receiving the wire states and converting each of the plurality of wire states to the corresponding symbol value may rely on a decoding chain having a plurality of decoding units, such as the decoding chain 404 or the decoding chain 404' described above with reference to FIG. 4A to FIG. 4E. Further details and/or sub-steps based on operations of the physical layer circuits 400 and 400' shown in FIG. 3A to FIG. 3E are omitted here for sake of brevity.

A difference between encoding architecture of the conventional art and the present disclosure is the sequence of the P2S converter and the encoding circuit and the architecture of the encoding circuit. In encoding architecture of the conventional art, the P2S converter is prior to the encoding circuit, while in the present disclosure the encoding circuit (e.g. the encoding chain 304/304') is prior to the P2S converter. Another difference between encoding architecture of the conventional art and the present disclosure is the encoding circuit (e.g. the encoding chain 304/304') of the present disclosure is implemented by a plurality of encoding units coupled in series. Due to such differences, the encoding circuit (e.g. the encoding chain 304/304') of the present disclosure is allowed to complete encoding operations on multiple consecutive symbols (e.g. 7 symbols) within a word interval (i.e., the transmission duration of the multiple consecutive symbols), while the encoding circuit of the conventional art needs to complete an encoding operation on an individual symbol within a symbol interval (i.e., the transmission duration of a single symbol). This provides more margin in avoiding timing violation. That is, assuming that the bit rate of the communication system is 2.5 Gsps per trio (e.g. 2.5 Gbps per lane), the symbol clock must be run to 400 ps±50% duty cycle, which means an encoding operation of the conventional art needs to be completed within 200 ps in the worst case. That is, the gate delay of the encoding circuit of the conventional art cannot exceed 200 ps. In contrast to this, as there will be a complementation in clock skew between a present clock and a next clock, the encoding operations on N consecutive symbols of the present disclosure only needs to be completed within ((N−1)*400+200)ps. In other words, a single one of the encoding units in the present disclosure is allowed to complete an encoding operation within ((N−1)*400+200)/N ps, which will be much longer than 200 ps.

Figure 5:
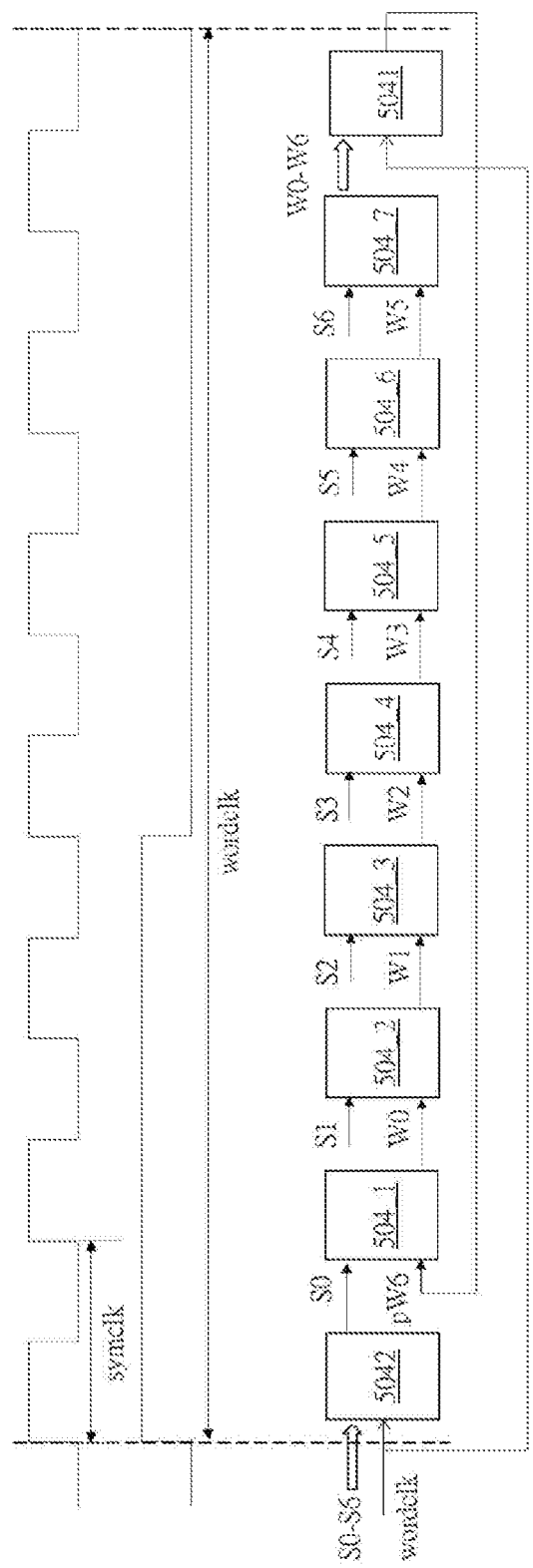
FIG. 5 illustrates an implementation of an encoding chain in the transmitter shown in FIG. 1 and associated signal waveforms in accordance with some embodiments of the present disclosure.

For example, referring to FIG. 5, an encoding chain 504 having seven encoding units 504_1-504_7 can be used for encoding seven consecutive symbols S0-S7 in accordance with some embodiments of the present disclosure. The encoding chain 504 can represent an embodiment of the encoding chain 304 shown in FIG. 3A or the encoding chain 304' shown in FIG. 3E. For example, the encoding chain 504 can represent an embodiment where the number of encoding units in the encoding chain 304 shown in FIG. 3C equals to 7. As another example, the encoding chain 504 can represent an embodiment where the number of encoding units in the encoding chain 304 shown in FIG. 3D equals to 7. In the present embodiment, the encoding chain 504 can be coupled between a flip-flop circuit 5041 and a flip-flop 5042. The flip-flop circuit 5041 can be an embodiment where the number of flip-flops in the flip-flop circuit 3041 shown in FIG. 3D equals to 7. The flip-flop circuit 5042 can be an embodiment where the number of flip-flops in the flip-flop circuit 3042 shown in FIG. 3D equals to 7. As shown in FIG. 5, a single one of the encoding units 504_1-504_7 is allowed to complete an encoding operation within ((7−1)*400+200)/7 ps, which will be much longer than 200 ps. As a result, requirement on the gate delay of an encoding unit is alleviated. Please note that the above explanations on the encoding architecture can be also applied to the decoding architecture. In view of above, the encoding and decoding architecture significantly alleviates the timing requirements on delays of the hardware components, thereby to avoid a potential timing violation in a high-speed serial data communication system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A physical layer circuit at a transmitter, comprising:
an encoding chain, configured to encode a plurality of symbols to generate a plurality of first wire states, the encoding chain comprising:
a plurality of encoding units coupled in series, arranged to receive the symbols respectively, and convert respective symbol values of the symbols to the first wire states respectively, wherein a first encoding unit of the encoding units is configured to convert a symbol value of a corresponding symbol according to a second wire state provided by a second encoding unit of the encoding units; and
a plurality of first flip-flops, coupled to the encoding units to receive the first wire states respectively, the first flip-flops being arranged to output the first wire states according to a first clock signal, respectively, wherein one of the first flip-flops is coupled between the first encoding unit and the second encoding unit, and the second wire state provided by the second encoding unit is sent to the first encoding unit through the one of the first flip-flops; the one of the first flip-flops is arranged to output the second wire state in a clock cycle of the first clock signal before the first flip-flops are arranged to output the first wire states in another clock cycle of the first clock signal.

2. The physical layer circuit of claim 1, wherein the second encoding unit is further coupled to another of the first flip-flops to receive a corresponding first wire state inputted to the another of the first flip-flops, and configured to convert a symbol value of a corresponding symbol according to the corresponding first wire state inputted to the another of the first flip-flops.

3. The physical layer circuit of claim 1, wherein at least one of the encoding units is arranged to convert a symbol value of a corresponding symbol according to a first wire state generated by a previous one of the encoding units coupled in series, thereby to derive a corresponding first wire state.

4. The physical layer circuit of claim 1, wherein the encoding units are configured to generate the first wire states within a clock cycle of the first clock signal.

5. The physical layer circuit of claim 1, further comprising:
a mapper, coupled to the encoding chain, the mapper being arranged to receive a word of data, and map the word of data to generate the symbols.

6. The physical layer circuit of claim 5, further comprising:
a buffer, couple to the mapper, the buffer being arranged to store the symbols according to a second clock signal, and output the symbols according to the first clock signal, wherein a first frequency of the first clock signal is different from a second frequency of the second clock signal.

7. The physical layer circuit of claim 6, wherein the buffer is configured to output N symbols in each clock cycle of the first clock signals, and store L symbols in each clock cycle of the second clock signals; N and L are positive integers; a ratio of the first frequency to the second frequency is determined according to a ratio of N to L.

8. The physical layer circuit of claim 1, further comprising:
a plurality of second flip-flops, coupled to the encoding units respectively, the second flip-flops being arranged to provide the symbols to the encoding units according to the first clock signal, respectively.

9. The physical layer circuit of claim 1, further comprising:
a parallel-to-serial (P2S) converter, coupled to the first flip-flops, the P2S converter being arranged to receive the first wire states, and serialize the first wire states to generate a sequence of wire states according to the first clock signal.

10. A physical layer circuit at a receiver, comprising:
a plurality of first flip-flops, arranged to output a plurality of first wire states according to a first clock signal respectively;
a decoding chain, coupled to the first flip-flops, the decoding chain being configured to decode the first wire states to generate a plurality of symbols, the decoding chain comprising:
a plurality of decoding units coupled in series, arranged to receive the first wire states respectively, and convert the first wire states to respective symbol values of the symbols respectively, wherein a first decoding unit of the decoding units is configured to convert a corresponding first wire state according to a second wire state provided by one of the first flip-flops coupled to a second decoding unit of the decoding units; and
a second flip-flop coupled between the one of the first flip-flops and the first decoding unit, wherein the second wire state provided by the one of the first flip-flops is sent to the first encoding unit through the second flip-flop.

11. The physical layer circuit of claim 10, wherein the second flip-flop is clocked by the first clock signal.

12. The physical layer circuit of claim 10, wherein the second flip-flop is arranged to send the second wire state to the first decoding unit in a clock cycle of the first clock signal before the first flip-flops are arranged to output the first wire states in another clock cycle of the first clock signal.

13. The physical layer circuit of claim 10, wherein one of the decoding units is arranged to convert a corresponding first wire state according to a corresponding first wire state outputted to another of the encoding units.

14. The physical layer circuit of claim 10, further comprising:
a serial-to-parallel (S2P) converter, coupled to the first flip-flops, the S2P converter being arranged to receive a sequence of wire states, and deserialize the sequence of wire states to generate the first wire states.

15. The physical layer circuit of claim 14, wherein at least one of the decoding units is arranged to convert a corresponding first wire state according to another first wire state; the another first wire state is received by the S2P converter immediately before the first wire state is received by the S2P converter.

16. The physical layer circuit of claim 10, wherein the decoding units are configured to generate the symbols within a clock cycle of the first clock signal.

17. The physical layer circuit of claim 10, further comprising:
a demapper, coupled to the decoding chain, the demapper being arranged to receive the symbols and generate a word of data by de-mapping at least the symbols.

18. The physical layer circuit of claim 17, further comprising:
a buffer, coupled to the decoding chain, the buffer being arranged to store the symbols generated by the decoding chain according to a second clock signal, and output the symbols according to the first clock signal, wherein a first frequency of the first clock signal is different from a second frequency of the second clock signal.

19. The physical layer circuit of claim 18, wherein the buffer is configured to output a first number of symbols in each clock cycle of the first clock signals, and store a second number of symbols in each clock cycle of the second clock signals; a ratio of the first frequency to the second frequency is determined according to the first number of symbols to the second number of symbols.

20. The physical layer circuit of claim 10, further comprising:
a plurality of third flip-flops, coupled to the decoding units to receive the symbols respectively, the third flip-flops being arranged to output the symbols according to the first clock signal, respectively.

21. The physical layer circuit of claim 1, wherein the transmitter is configured to perform signal transmission through a multi-wire communication link comprising at least three wires, signals on the at least three wires has three voltage levels, and each of the first wire states is determined according to respective voltage levels on the at least three wires.

* * * * *